United States Patent [19]
Cunningham et al.

[11] Patent Number: 5,657,641
[45] Date of Patent: Aug. 19, 1997

[54] PANEL MOUNTED COOLING SYSTEM

[75] Inventors: James J. Cunningham, Hamilton Square, N.J.; Boris Muzikant, Pipersville; Solomon Reznik, North Wales, both of Pa.

[73] Assignee: Kooltronic, Inc., Hopewell, N.J.

[21] Appl. No.: 527,878

[22] Filed: Sep. 13, 1995

[51] Int. Cl.[6] ....................................................... H05K 5/00
[52] U.S. Cl. .............................. 62/263; 361/691; 454/184
[58] Field of Search ............................. 62/263, 259.2; 165/104.34; 361/691; 454/184, 236, 251, 253

[56] References Cited

U.S. PATENT DOCUMENTS

| | | | |
|---|---|---|---|
| 3,559,728 | 2/1971 | Lyman et al. | 165/104.34 |
| 3,788,388 | 1/1974 | Barkmann | 165/32 |
| 3,807,493 | 4/1974 | Stewart | 165/105 |
| 3,888,304 | 6/1975 | Laing | 165/86 |
| 4,027,498 | 6/1977 | Fessler | 62/263 |
| 4,203,302 | 5/1980 | Lapeyre | 62/263 X |
| 4,424,686 | 1/1984 | Lapeyre et al. | 62/263 X |
| 4,544,023 | 10/1985 | Marciniak | 62/263 X |
| 4,600,050 | 7/1986 | Noren | 165/104.14 |
| 4,665,466 | 5/1987 | Green | 361/384 |
| 4,706,739 | 11/1987 | Noren | 165/104.14 |
| 4,802,060 | 1/1989 | Immel | 361/691 X |
| 4,911,231 | 3/1990 | Horne et al. | 165/104.34 |
| 5,035,281 | 7/1991 | Neuenfeldt et al. | 165/104.34 X |
| 5,105,336 | 4/1992 | Jacoby et al. | 361/383 |
| 5,136,464 | 8/1992 | Ohmori | 361/384 |
| 5,187,950 | 2/1993 | Weldon | 62/263 X |
| 5,435,377 | 7/1995 | Kratochvil | 454/253 X |

OTHER PUBLICATIONS

New Product Release of M/TAB (Mounting Template And Assembly Bracket) by Kooltronic, Inc. dated Oct. 1992.

*Primary Examiner*—Harold Joyce
*Attorney, Agent, or Firm*—Morgan & Finnegan, L.L.P.

[57] ABSTRACT

A cooling system for cooling warm air within the interior of a closed electrical cabinet containing electronic equipment or the like, comprising an enclosure adapted to be mounted on an exterior surface of the cabinet. The interior of the enclosure is separated into an internal circulation region and an external circulation region. Ambient air for removing heat from a condenser coil is drawn into the external circulation region through the bottom of the enclosure and the ambient air is also discharged out the bottom of the enclosure at a higher velocity than the ambient air being drawn into the bottom of the enclosure.

59 Claims, 15 Drawing Sheets

PANEL MOUNTED COOLING SYSTEM

BACKGROUND OF THE INVENTION

1. Field of the Invention

The present invention relates generally to cooling systems, and more particularly, to a self-contained, weather resistant, closed-loop cooling system which may be mounted on the exterior of an electrical cabinet for cooling electronic equipment within the cabinet.

2. Description of the Related Art

In a wide variety of indoor and outdoor, industrial and/or commercial applications, it is quite common for sensitive electronic equipment to be employed in environments where extreme temperature and/or humidity exist. These environments may also develop or create noxious and/or damaging fumes of a chemical nature which are emitted as by-products of the particular processes and/or machinery which the electronic equipment is designed to control.

As such, it is common to mount such sensitive electronic equipment within a sealed electric cabinet or enclosure in order to protect the sensitive electronic equipment from hostile elements outside the cabinet. The National Electrical Manufacturers Association (NEMA) has promulgated certain industry-wide standards for rating the ability of electrical cabinets (or other enclosures) to protect their interior from hostile elements outside the cabinet.

For instance, for an electrical cabinet or other enclosure to be rated NEMA 3R, it must be capable of providing a degree of outdoor protection against falling rain and sleet and be undamaged by the formation of ice on the cabinet. Similarly, to attain a rating of NEMA 4, an electrical cabinet must provide a degree of indoor or outdoor protection against splashing water, windblown dust and rain, and hose-directed water, and be undamaged by the formation of ice on the cabinet. A NEMA 4X rating contains all of the requirements of a NEMA 4 rating and further requires corrosion resistance.

Additionally, since electronic equipment frequently generate heat during their operation, temperature and humidity conditions within the cabinet housing the equipment must be closely controlled to further protect the electronic equipment from excessive heat and/or humidity within the cabinet. Therefore, heat generated by the sensitive electronic equipment within the cabinet must frequently be dissipated to the outside (ambient air side) of the cabinet as rapidly as it is produced.

Accordingly, to effectively cool the electronic equipment (and dehumidify the air within the cabinet depending upon the cooling system employed), while at the same time maintaining the protection of the electronic equipment from the hostile elements outside the cabinet, a closed-loop cooling system is commonly used which does not circulate air between the interior (warm air side) and exterior (ambient air side) of the cabinet. Instead, these closed-loop cooling systems provide two separate circulation systems. An internal circulation system cools and dehumidifies warm air within the electrical cabinet, totally isolating the sensitive electronics and other components from the outside environment. An external circulation system uses circulated ambient (outside) air to discharge the heat removed from the electronics within the enclosure.

These closed-loop cooling systems are typically single enclosures panel-mounted on the exterior of the electrical cabinet. One or more openings are generally cut into the electrical cabinet relative to the inlet and exhaust openings of the internal circulation system of the cooling system to facilitate air flow between the interior of the electrical cabinet and the cooling system. In this manner, the heat from the electronic equipment may be dissipated from the cabinet by an air conditioner with an air-cooled condenser or by a refrigerant-free heat exchanger.

In a closed-loop cooling system of the type comprising an air conditioner, such as that illustrated in FIG. 1, the heat is dissipated from the cabinet by means of a vapor compression refrigeration cycle in a hermetically-sealed refrigeration system [28] comprising a compressor [28'] and utilizing an air-cooled condenser coil [24]. The warm air [12] within the cabinet [10] is drawn into the internal circulation system in the front of the cooling system enclosure [20] by one or more fans or blowers and passes through an evaporator coil [22] within the cooling system where the warm air [12] is cooled, dehumidified and recirculated back into the cabinet [10] through the front of the cooling system enclosure [20] as illustrated by arrow [14] in FIG. 1.

The heat removed by the evaporator coil [22] is transferred by compressed refrigerant to a condenser coil [24] within the cooling system enclosure [20]. Ambient air [16] from outside the cabinet [10] is generally drawn into the top, rear, or sides of the cooling system enclosure [20] by one or more fans or blowers [26] and is passed through the condenser coil [24]. This ambient air flow absorbs the heat from the condenser coil [24] and is thereafter typically discharged to the ambient environment outside the cabinet [10] through the top, rear or sides of the cooling system enclosure [20] as illustrated by arrow [18] in FIG. 1.

A problem associated with these conventional closed-loop cooling systems stems from the fact that they require cutting one or more openings through the electrical cabinet relative the inlet and exhaust openings of the internal circulation system of the cooling system to facilitate air flow between the interior of the electrical cabinet and the cooling system enclosure. The ability to protect the interior of the electrical cabinet from the hostile environment outside the cabinet—and therefore the ability to maintain the desired NEMA rating—becomes increasingly difficult because the integrity of the electrical cabinet has now been compromised by these openings. In addition, the mounting of the cooling system enclosure—which is at least partially open to the outside environment to permit ambient cooling air to be supplied into and exhausted from the cooling system enclosure—will frequently lead to diminished protection of the interior of the electrical cabinet from the outside environment.

SUMMARY OF INVENTION

The above and other problems of the prior art are solved by the present invention which provides a closed-loop cooling system capable of being panel-mounted on the exterior of an electrical cabinet containing sensitive electronic equipment, wherein the ambient air is supplied to and exhausted from the bottom of the cooling system.

In accordance with the invention, the cooling system cools and dehumidifies warm air within the interior of the electrical cabinet. The cooling system enclosure which is adapted to be mounted on the exterior surface of the cabinet includes a bottom portion and a from portion. The interior of the enclosure is separated into an internal circulation region and an external circulation region fluidly sealed from one another. The bottom portion of the enclosure comprises an inlet opening and an exhaust opening fluidly connecting the external circulation region to ambient air outside the enclosure to enable one or more ambient air blowers or fans mounted within the external circulation region to draw ambient cooling air into the external circulation region through the inlet opening in the bottom of the enclosure. The ambient air blower(s) exhaust the ambient air from the enclosure through the exhaust opening in the bottom of the enclosure.

In accordance with another aspect of the invention, a bracket is utilized to position and mount the cooling system enclosure on the surface of the electrical cabinet. The bracket comprises a plate conforming generally to the shape and dimension of the cooling system enclosure. The plate has at least one opening therein. The plate is mounted on the cabinet and the opening is used as a template for cutting at least one passage or cut-out therethrough. Each vertical side of the plate has a dependent flange adapted to support and mount the enclosure to the bracket. When installed, the warm air within the cabinet may be drawn through the cut-out into the internal circulation region of the enclosure and cooled before being recirculated back into the cabinet.

The foregoing specific objects and advantages of the invention are illustrative of those which can be achieved by the present invention and are not intended to be exhaustive or limiting of the possible advantages which can be realized. For instance, the cooling system may comprise an refrigerant type air conditioner or a refrigerant free heat exchanger. Thus, the objects and advantages of this invention will be apparent from the description herein or can be learned from practicing the invention, both as embodied herein or as modified in view of any variations which may be apparent to those skilled in the art. Accordingly, the present invention resides in the novel parts, constructions, arrangements, combinations and improvements herein shown and described.

BRIEF DESCRIPTION OF THE DRAWINGS

The foregoing features and other aspects of the invention are explained in the following description taken in connection with the accompanying drawings wherein.

DESCRIPTION OF THE PREFERRED EMBODIMENTS

Figure 1:
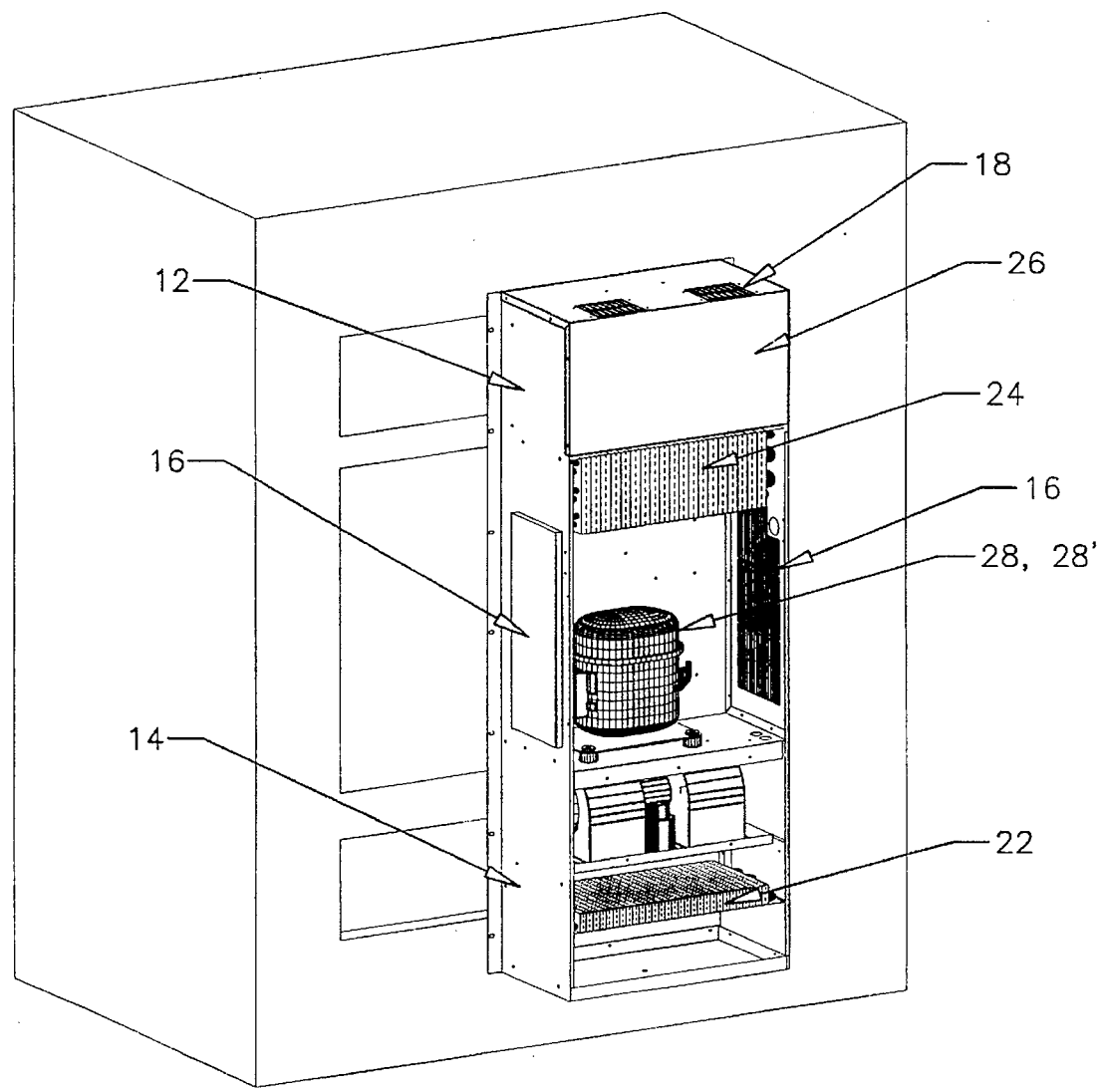
FIG. 1 is a schematic of a prior art cooling system mounted on the exterior of an electrical cabinet.
Figure 2:
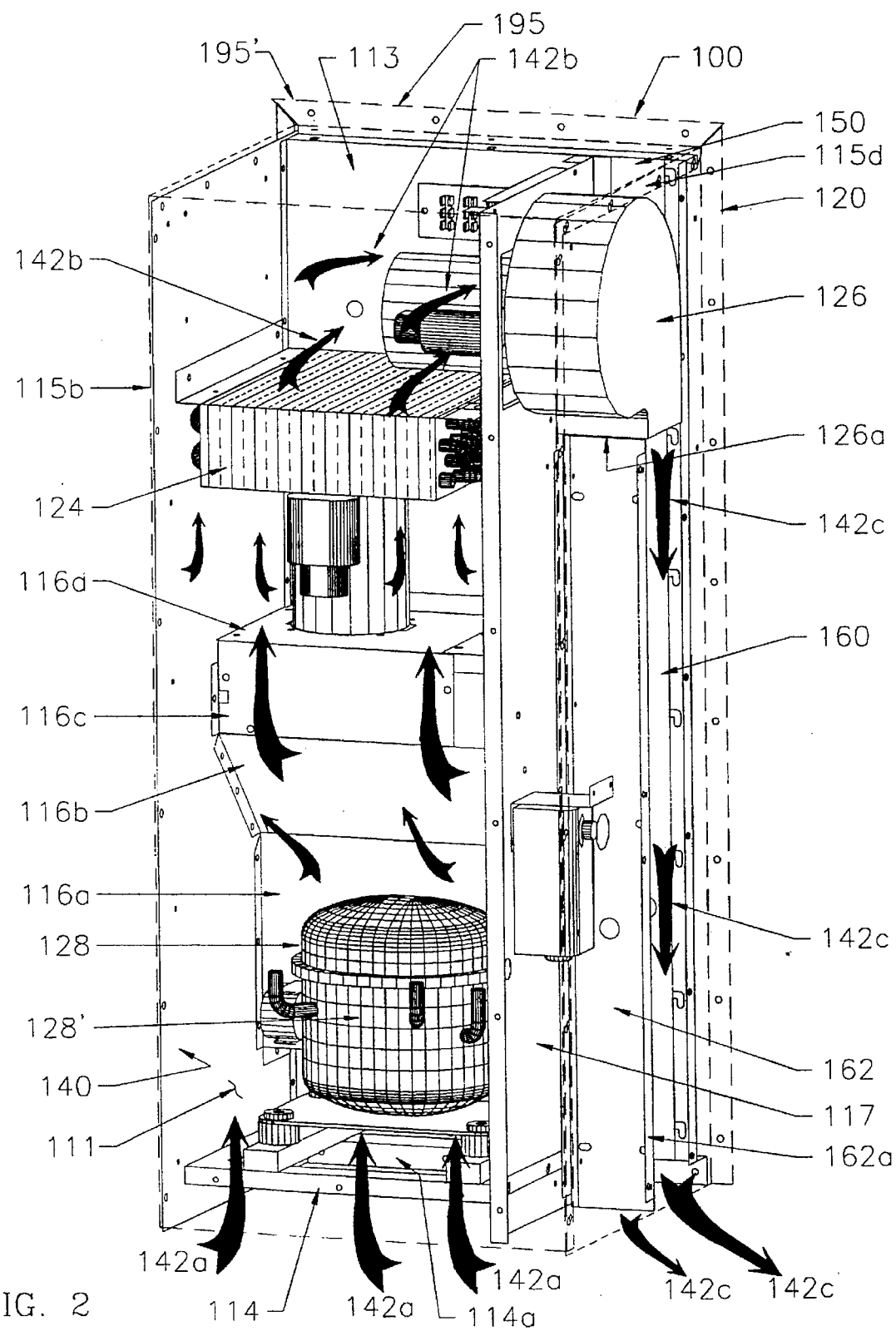
FIG. 2 is a perspective view of the cooling system according to a preferred embodiment of the present invention.
Figure 3:
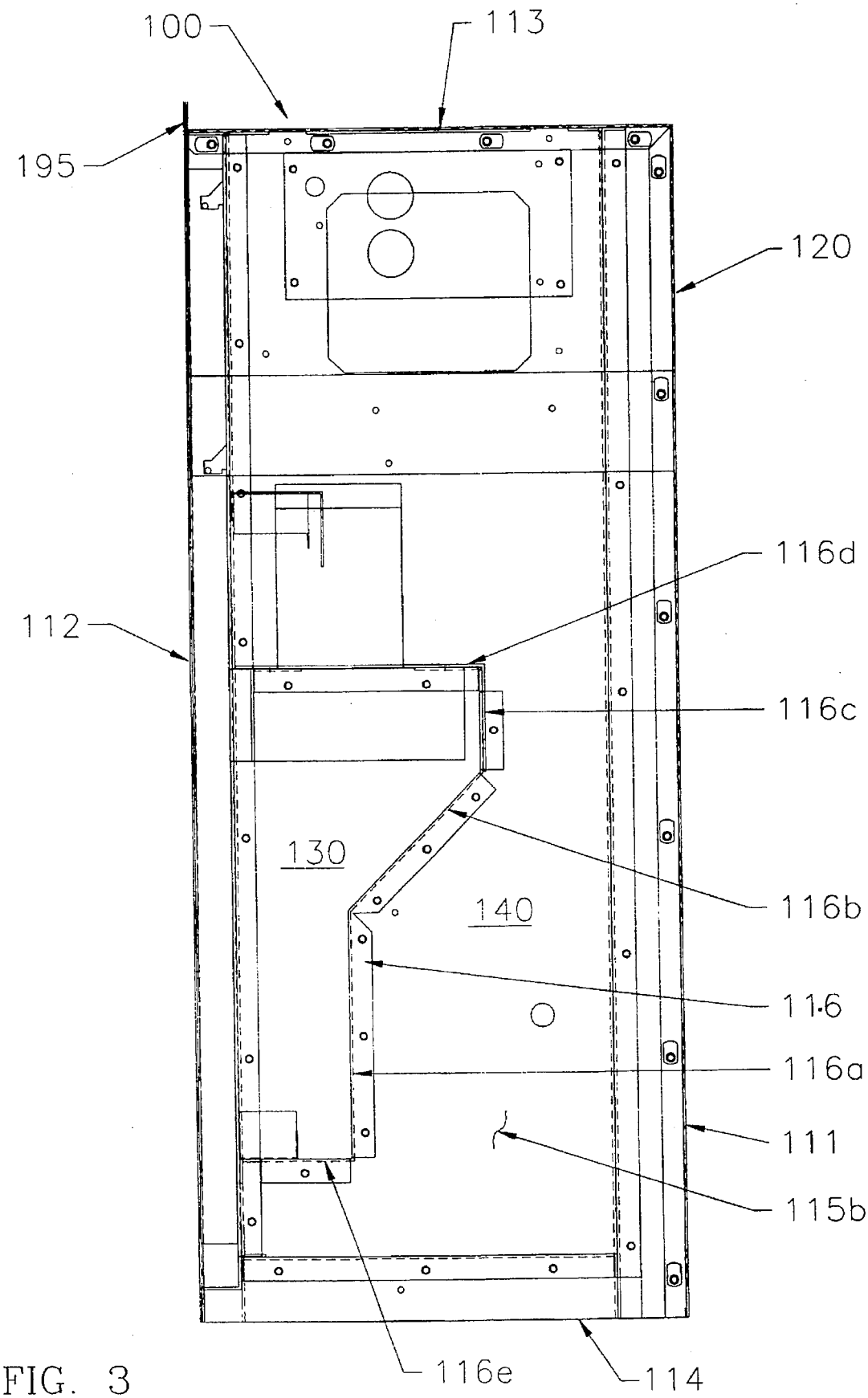
FIG. 3 is a right side elevational view of the structure of FIG. 2.

FIG. 2 illustrates a cooling unit [100] according to the present invention which may be mounted on the exterior of an electrical cabinet, such as the cabinet [10] illustrated in FIG. 1. The cooling unit [100] comprises an enclosure [120] having a front [112], rear [111], top [113], bottom [114] and two sides [115a, 115b]. The sides [115a, 115b], bottom [114] and front [112] are secured to one another. The rear [111] and top [113] are removably secured to the sides, bottom and front of the enclosure to permit structural rigidity and convenience of assembly of the cooling system [100] within the enclosure [120]. The enclosure is preferably made of stainless steel sheet metal.

Within the enclosure [120] is a central divider [116] and an internal side wall [117], which are both preferably made from galvanized steel sheet metal. The internal side wall [117] is substantially parallel with and spaced apart from the sides [115a, 115b]. The internal side wall [117] is positioned nearest side [115a] and is attached to the bottom [114] and front [112] of the enclosure [120].

The central divider [116] is substantially perpendicular to sides [115a, 115b] and internal side wall [117]. The central divider [116] comprises first and second upstanding portions [116a, 116c] which are joined together by angular portion [116b] to form a vertical assembly. Top and bottom portions [116d, 116e] are joined to the top and bottom of the vertical assembly and the central divider [116] is attached to side [115b], internal side wall [117] and front [112] of the enclosure [120].

In this manner, the central divider [116] separates a portion of the front [112] and rear [111] of the enclosure [120] into two isolated regions: an internal circulation region [130] contained within the central divider [116] proximate the front [112] of the enclosure [120]; and an external circulation region [140] outside the central divider [116] proximate the rear [111] and top [113] of the enclosure [120].

The portions [116a–116e] of the central divider [116] are joined together and to side [115b], side wall [117] and front [112] in such a manner as to effectively seal the internal circulation region [130] from the external circulation region [140], such as through the use of flanges, gaskets, riveting, welding and/or other known fastening techniques.

A refrigeration system [128] known in the art, comprising a compressor [128'], is mounted within the external circulation region [140] and is supported by the bottom [114] of the enclosure [120]. The refrigeration system [128] is used for cooling a known evaporator coil [134] which is mounted in the internal circulation region [130] of the enclosure [120] and through which warm air [12] from within the electrical cabinet [10] passes.

Within the external circulation region [140] and towards the top [113] of the enclosure [120] is a condenser coil [124] of known type. The condenser coil [124] is essentially perpendicular to and supported by side [115b] and internal side wall [117].

The internal side wall [117] further divides the interior of the enclosure into a third region [150] between internal side wall [117] and side [115a]. An ambient air(condenser) blower [126] of known type is positioned within this third region [150] near the top [113] of enclosure [120] at an elevation above the condenser coil [124] and is supported by internal side wall [117]. The spacing of internal side wall [117] from side [115a]—which define the width of the third region [150]—is essentially the same as the axial width of the blower housing [126].

The blower [126] has a generally rectangular exhaust opening [126a] constrained on three sides by side [115a], internal side wall [117] and front [112] of the enclosure [120]. A channel member [162], having a width essentially the same as the distance between the internal side wall [117] and side [115a], is positioned within the third region [150]. The channel member [162] is preferably made from galvanized steel, stainless steel or aluminum sheet metal, and is formed with depending flanges [162a] on each vertical side. The flanges [162a] of the channel member [162] are joined to the internal side wall [117] and side [115a] respectively. The channel member [162] extends upwardly from the bottom [114] of the enclosure [120] and engages the unconstrained side of the blower exhaust opening to thereby define a substantially continuous discharge tube or duct [160] extending from the blower exhaust opening [126a] toward the bottom [114] of the enclosure [120]. The discharge duct [160] is open to the ambient environment about its lower extremity in proximity to the bottom [114] of the enclosure [120].

The bottom [114] of the enclosure [120] has an intake opening [114a] about the external circulation region [140] beneath compressor [128']. In this manner, blower [126] draws ambient air at a low velocity from outside the cabinet [10] and enclosure [120] upwardly through the opening [114a] in the bottom [114] and into the external circulation region [140], as shown by arrows [142a] in FIG. 2. The ambient air flow [142a] passes over and cools the compressor [128'] (and other components in the enclosure) and continues toward the top [113] where the ambient air passes through and absorbs heat from the condenser coil [124]. This heated ambient air is illustrated by arrows [142b] in FIG. 2.

The heated ambient air [142b] is drawn into the blower [126] and is forced out of the blower [126] at a high velocity into the discharge duct [160], as illustrated by arrows [142c]. The high velocity heated ambient air [142c] flows downwardly through the discharge duct [160] and is exhausted from the enclosure [120] through the opening in the lower extremity of the discharge duct [160] proximate the bottom [114] of the enclosure.

To assure proper and efficient heat transfer, the ambient air [142c] is exhausted from beneath the enclosure [120] at a higher velocity than the ambient air [142a] entering the bottom [114] of the enclosure. This prevents the mixing of hot, exhausted ambient air [142c] with the ambient air [142a] being drawn into the enclosure [120] so that only relatively cool ambient air is allowed to enter the enclosure [120].

Accordingly, ambient air for cooling is introduced into and exhausted from beneath the enclosure [120]. By locating the ambient air inlet and exhaust beneath the enclosure [120], the top [113], sides [115a, 115b], front [112] and rear [111] protect the interior of the enclosure [120] from direct and indirect rain, as well as from the direct impact of a hose-directed stream of water. Such minimization of the amount of moisture accessible to the interior of the enclosure [120] further shields the central divider [116] from such moisture or other hostile environmental elements, thereby protecting the internal circulation region [130] and the interior of the electrical cabinet [10] from the ambient (outside) environment.

As discussed above, the central divider [116]is joined to side [115b], side wall [117] and front [112] in such a manner as to effectively seal the internal circulation region [130] from the external circulation region [140]. A warm air (evaporator) blower [132] is positioned within the internal circulation region [130] of the enclosure [120] and draws warm air [12] into the internal circulation region [130] through a warm air inlet opening [170] in the front [112] of the enclosure [120].

The warm air [12] entering the enclosure [120] is drawn through an evaporator coil [134] known in the art, which is mounted within the internal circulation region [130] of the enclosure. The evaporator coil [134] cools and dehumidifies the warm air passing over it and the warm air (evaporator) blower [132] forces the cooled air [14] within the internal circulation region [130] out of the enclosure [120] and back into the electrical cabinet [10] through an exhaust opening [172] in the front [112] of the enclosure.

Figure 6:
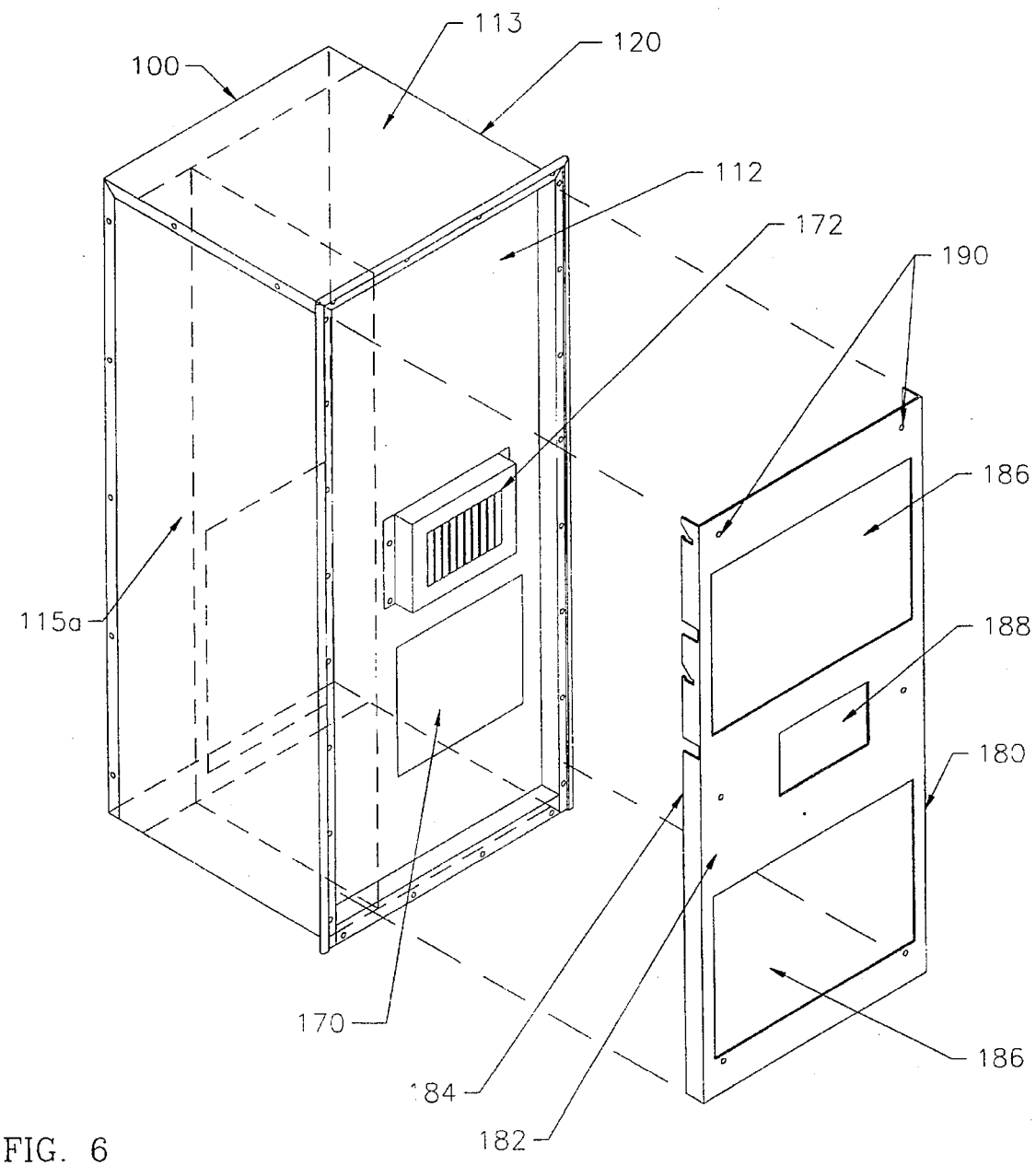
FIG. 6 is an exploded perspective view of the structure of FIG. 2 connected to a mounting template and assembly bracket.
Figure 7:
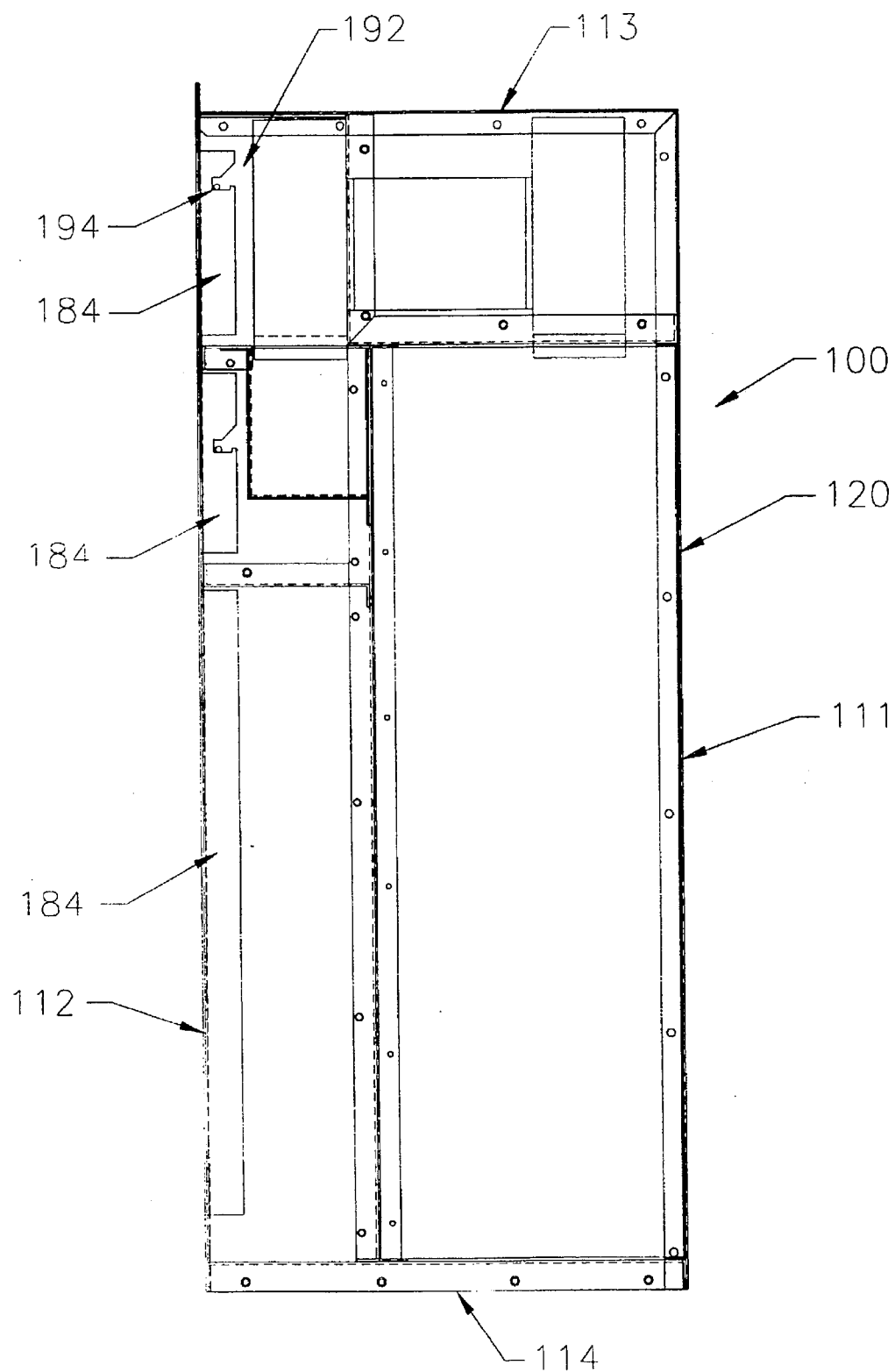
FIG. 7 is a right side elevational view of the structure of FIGS. 2 and 6.
Figure 7A:
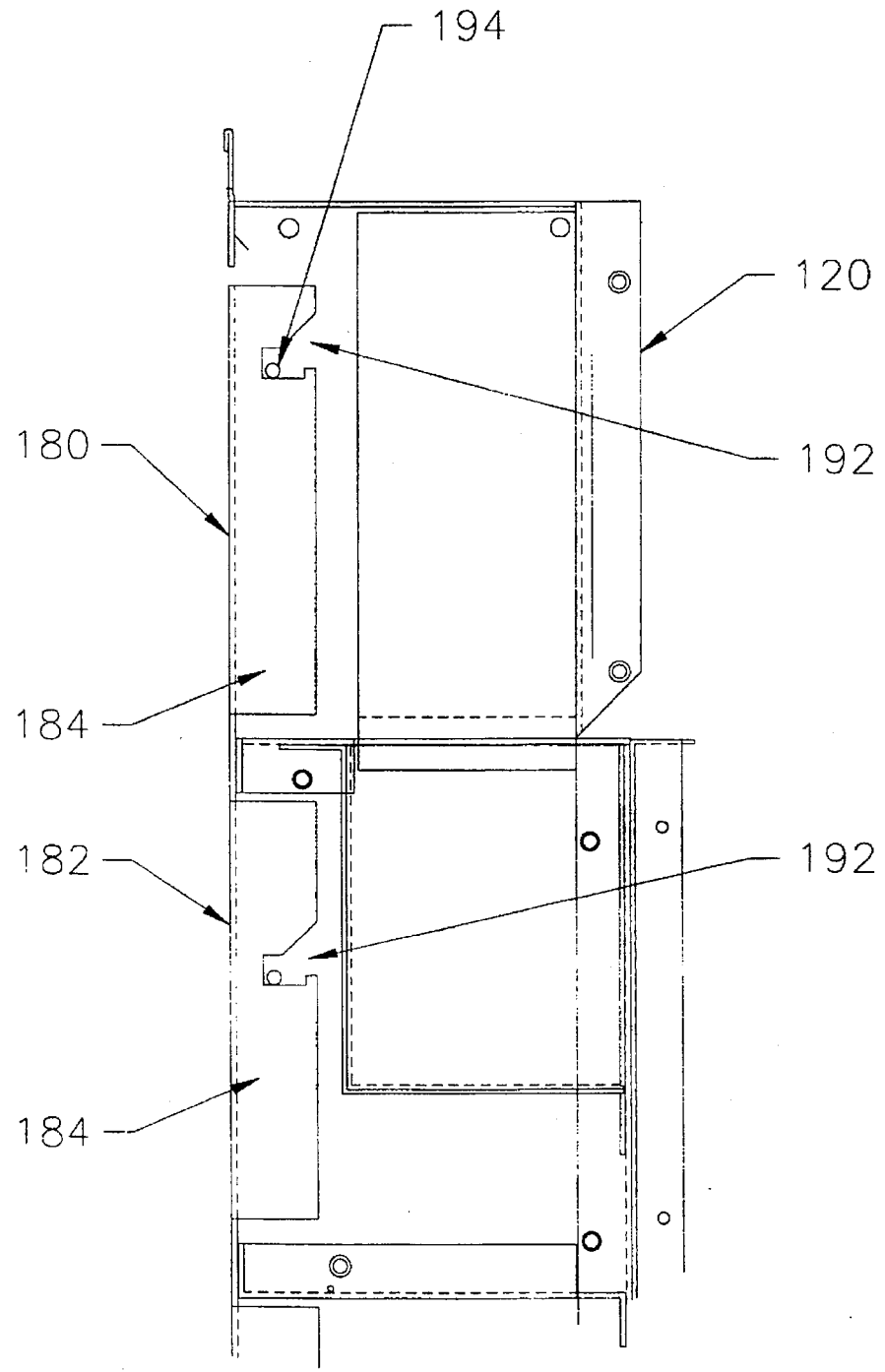
FIG. 7A is an enlarged view illustrating the hook/slot arrangement of the structure of FIG. 7.

As illustrated in FIGS. 6 and 7, the cooling system [100] is also provided with a mounting template and assembly bracket (M/TAB) [180] of the type known in the art for positioning and mounting a cooling unit enclosure on an electrical cabinet. The M/TAB [180] comprises a substantially flat plate [182] having a configuration to conform generally with the shape and dimension of the front [112] of the enclosure [120]. Each vertical side of the plate [182] has a dependent flange [184] formed thereon at an angle from the plate [182] which is preferably about 90°. The width of the plate [182] between flanges [184] is slightly less than the width of enclosure [120] so that the M/TAB [180] may be tightly received between peripheral flanges [195] projecting outwardly from the front [112] of the enclosure [120] and bending at an angle of approximately 90°. The peripheral flanges [195] may be formed integral to the enclosure [120] and may extend around all of the periphery of the front [112] of the enclosure [120].

Preferably, the plate [182] has an inlet opening [186] and an exhaust opening [188] relative the warm air inlet opening [170] and warm air exhaust opening [172], respectively, in the enclosure [120] to permit ingress of warm air [12] into and egress of cooled air [14] from the internal circulation region [130] of the enclosure. A number of holes [190] are also provided through the plate [182] for attaching the M/TAB [180] to the exterior of the electrical cabinet [10].

To install the cooling unit [100] to the exterior of the electrical cabinet [10], the M/TAB [180] is held at the desired location on the cabinet exterior and holes are drilled through the cabinet [10] corresponding to mounting holes [190]. A suitable gasketing material (not shown) may be inserted between the M/TAB and the cabinet. The M/TAB [180] is fastened to the cabinet [10] by placing any of a number of well known fasteners (such as mounting bolts, washers, and nuts) through the respective drilled holes and mounting holes [190].

After the M/TAB is mounted on the cabinet [10], the M/TAB [180] is used as a template for cutting the supply and return openings in the cabinet [10] in corresponding relation to the inlet and exhaust openings [186, 188] in the M/TAB [180]—which inlet and exhaust openings correspond to the inlet and exhaust openings [170, 172] in the front [112] of the enclosure [120].

A suitable gasketing material (not shown) is placed about the outside circumference of the front [112] and/or on the outside surface of the terminal portion [195a] of the peripheral flanges [195] of the enclosure [120], which terminal portions [195a] are bent at approximately 90°. The enclosure [120] is then hung on the M/TAB [180] by aligning and placing the peripheral flanges [195] projecting from the front [112] of the enclosure [120] over the dependent flanges [184] of the M/TAB [180] so that the M/TAB is tightly received between the peripheral flanges [195]. Each dependent flange [184] includes a plurality of slots [192] which are adapted to receive respective hooks or pins [194] projecting inwardly from the side panels [115a, 115b] of the enclosure [120] proximate the peripheral flanges [195] or from the peripheral flanges [195] themselves. When the hooks [194] are received within the corresponding slots [192], the M/TAB [180] will support the enclosure [120]. Alternatively, for applications requiring less environmental protection, it is understood that the slots [192] and corresponding hooks [194] could be formed on the peripheral flanges [195] or side panels [115a, 115b] of the enclosure [120] and the dependent flanges [184], respectively.

Once the enclosure [120] is hung on the M/TAB [180], holes are then drilled through the gasket and cabinet [10] in alignment with and corresponding to mounting holes [196] formed in the peripheral flanges [195] of the enclosure [120]. Alternatively, the gasket may contain preformed holes corresponding to and in alignment with the mounting holes [196]. The enclosure [120] is secured to the cabinet [10] (with the gasket between the enclosure and cabinet) by inserting any of a number of well known fasteners (such as stainless steel mounting bolts equipped with sealing washers and nuts) through the aligned holes in each flange of the enclosure [120], gasket and cabinet [10]. The fasteners are torqued to a predetermined amount to provide a compressive force to the peripheral enclosure flanges [195], thereby transferring a sealing force to the flange/gasket/cabinet interface. Mounting of the enclosure [120] to the cabinet [10] in the above-described manner has been shown to ease installation by reducing the labor required to mount the enclosure [120], and reduce installation time and potential mounting errors.

As illustrated in FIGS. 13A-13D, the peripheral flanges [195] may be preferably formed from stainless steel sheet metal or other suitable materials in a variety of configurations to enhance the sealing interface between the enclosure [120] and the electrical cabinet [10]. As mentioned above, the peripheral flange [195] projects outwardly from the front [112] of the enclosure [120] and has a terminal portion [195a] which is bent at approximately 90°. The terminal portion [195a] has an inside surface proximate the enclosure [120] and an outside surface facing away from the enclosure [120]. It is this outside surface of the peripheral flange [195] which compresses the gasket against the electrical cabinet [10] to effect a seal between the cabinet [10] and the enclosure [120].

Figure 13A:
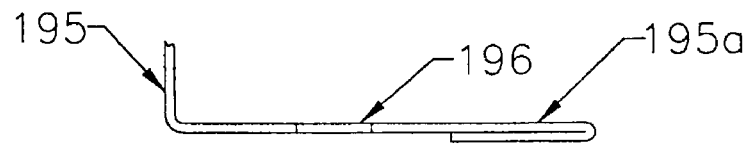
FIGS. 13A–13G illustrate alternative peripheral flange designs forming part of the cooling systems illustrated in FIGS. 2 and 8.

Referring to FIG. 13A, the terminal portion [195a] of the peripheral flange [195] is bent at approximately 180° at its distal end (end furthest away from the enclosure [120]) so that part of the terminal portion [195a] has a thickness twice that of the remainder of the peripheral flange [195]. This configuration provides a concentrated sealing force between the outside terminal portion [195a] of the peripheral flange [195], gasket and the electrical cabinet [10] due to the slight angular contact created by the increased thickness of a part of the terminal portion [195a].

Figure 13B:
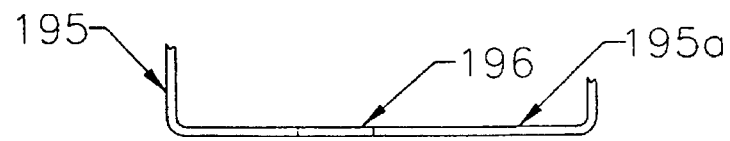

FIG. 13B illustrates an second alternative configuration of the terminal portion [195a] of the peripheral flange [195] wherein the terminal portion [195a] is of single thickness and is bent at its distal end at approximately 90° to form an L-shape.

Figure 13C:
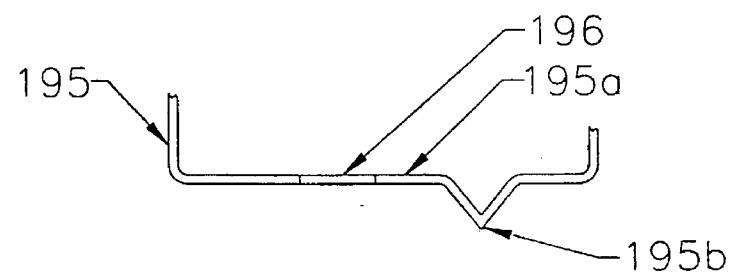

FIG. 13C illustrates a third alternative configuration of the terminal portion [195a] of the peripheral flange [195] wherein the terminal portion [195a] forms an L-shape similar to that illustrated in FIG. 13B. However, this third configuration also comprises a sharp, v-shaped longitudinal rib [195b] projecting outwardly from the outer terminal portion [195a]. The v-shaped longitudinal rib [195b] provides a concentrated sealing force between the outside terminal portion [195a] of the peripheral flange [195], gasket and the electrical cabinet [10] due to the high force line contact across the rib [195b].

Figure 13D:
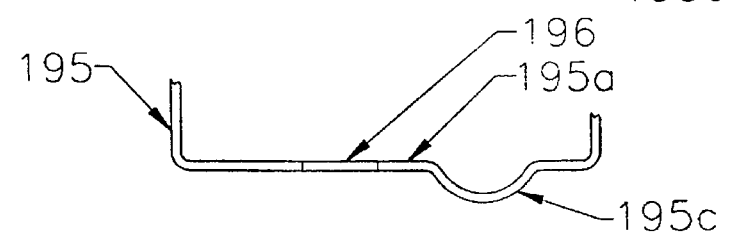

FIG. 13D illustrates a fourth alternative configuration of the terminal portion [195a] which is similar to that illustrated in FIG. 13C. However, in this configuration, a longitudinal, outwardly projecting, radiused rib [195c] is substituted for the v-shaped longitudinal rib illustrated in FIG. 13C. Again the radiused longitudinal rib [195c] provides a concentrated sealing force between the outside terminal portion [195a] of the peripheral flange [195], gasket and the electrical cabinet [10] due to the high force line contact across the rib [195c].

Figure 13E:
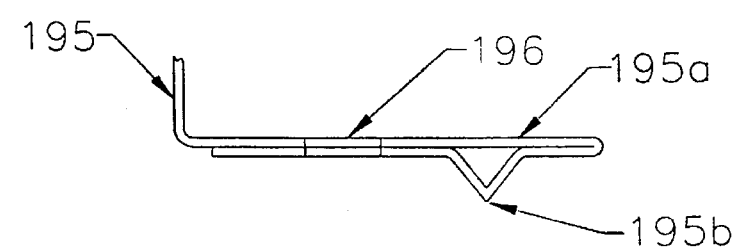
Figure 13F:
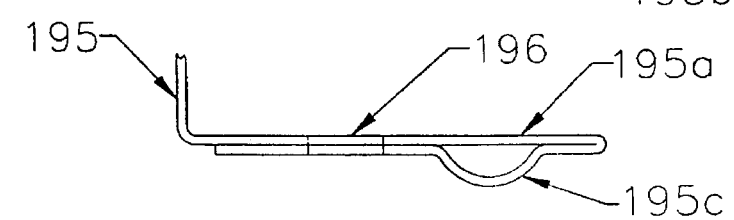
Figure 13G:
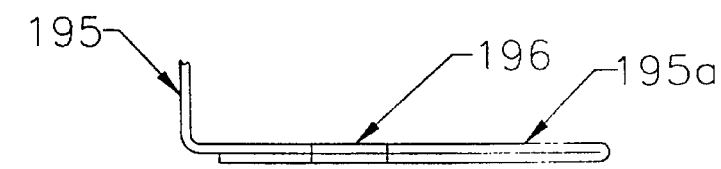

A fifth alternative configuration of the terminal portion [195a] is illustrated in FIG. 13G. In this configuration, the distal end of the terminal portion [195a] is folded about itself at approximately 180° so that a significant portion of the terminal portion is of double thickness.

FIGS. 13E and 13F illustrate sixth and seventh alternative configurations of the terminal portion [195a] of the peripheral flange [195] respectively. Each of these embodiments are of similar design to the double thickness configuration illustrated in FIG. 13G. However, the configurations illustrated in FIG. 13E also comprise a sharp, v-shaped longitudinal rib [195b] projecting outwardly from the outside surface of the terminal portion [195a] and the configuration illustrated in FIG. 13F comprises a longitudinal, outwardly projecting, radiused rib [195c] projecting outwardly from the outside surface of the terminal portion [195a].

Figure 4:
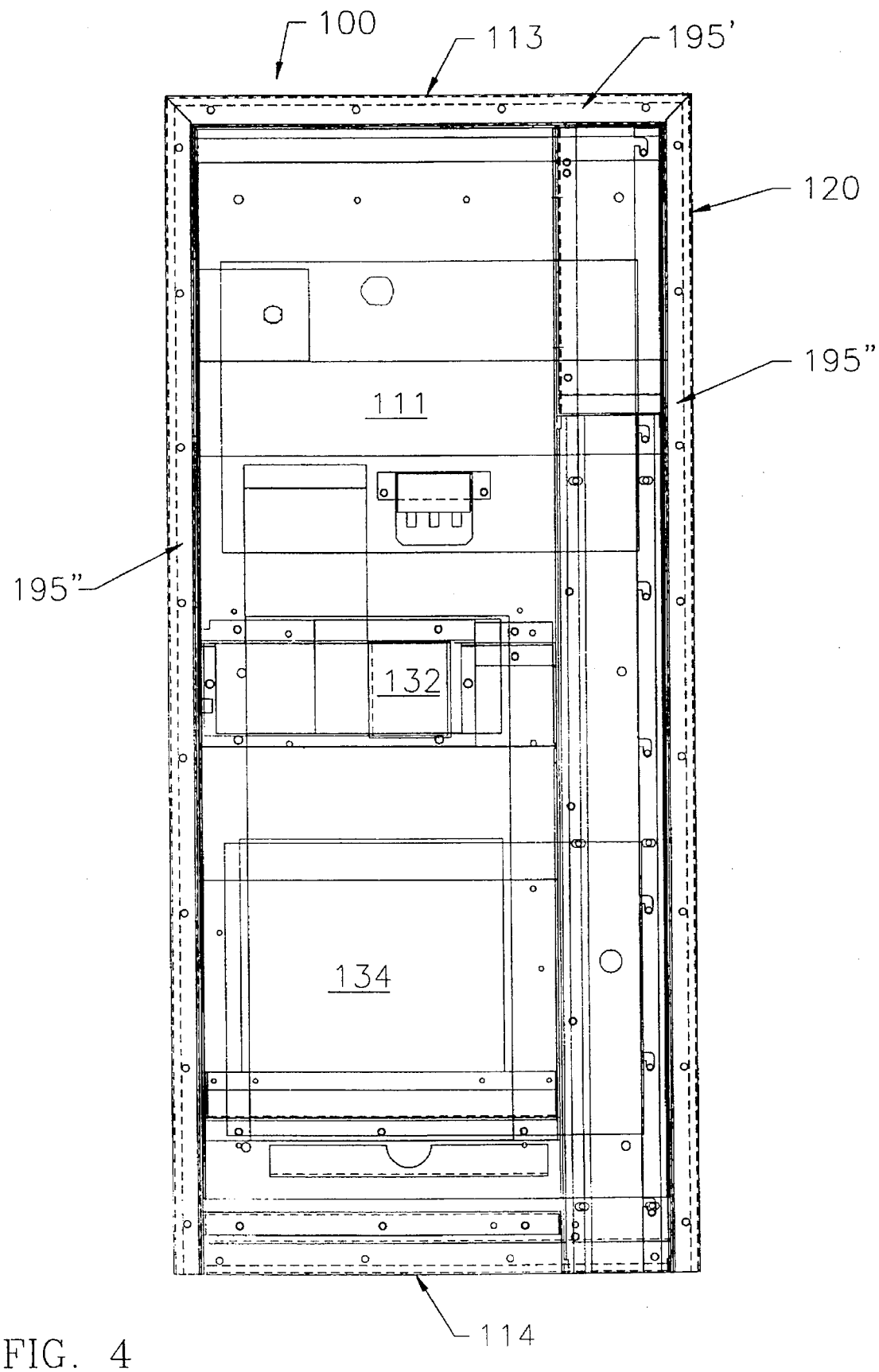
FIG. 4 is a front elevational view of the structure of FIG. 2.
Figure 5:
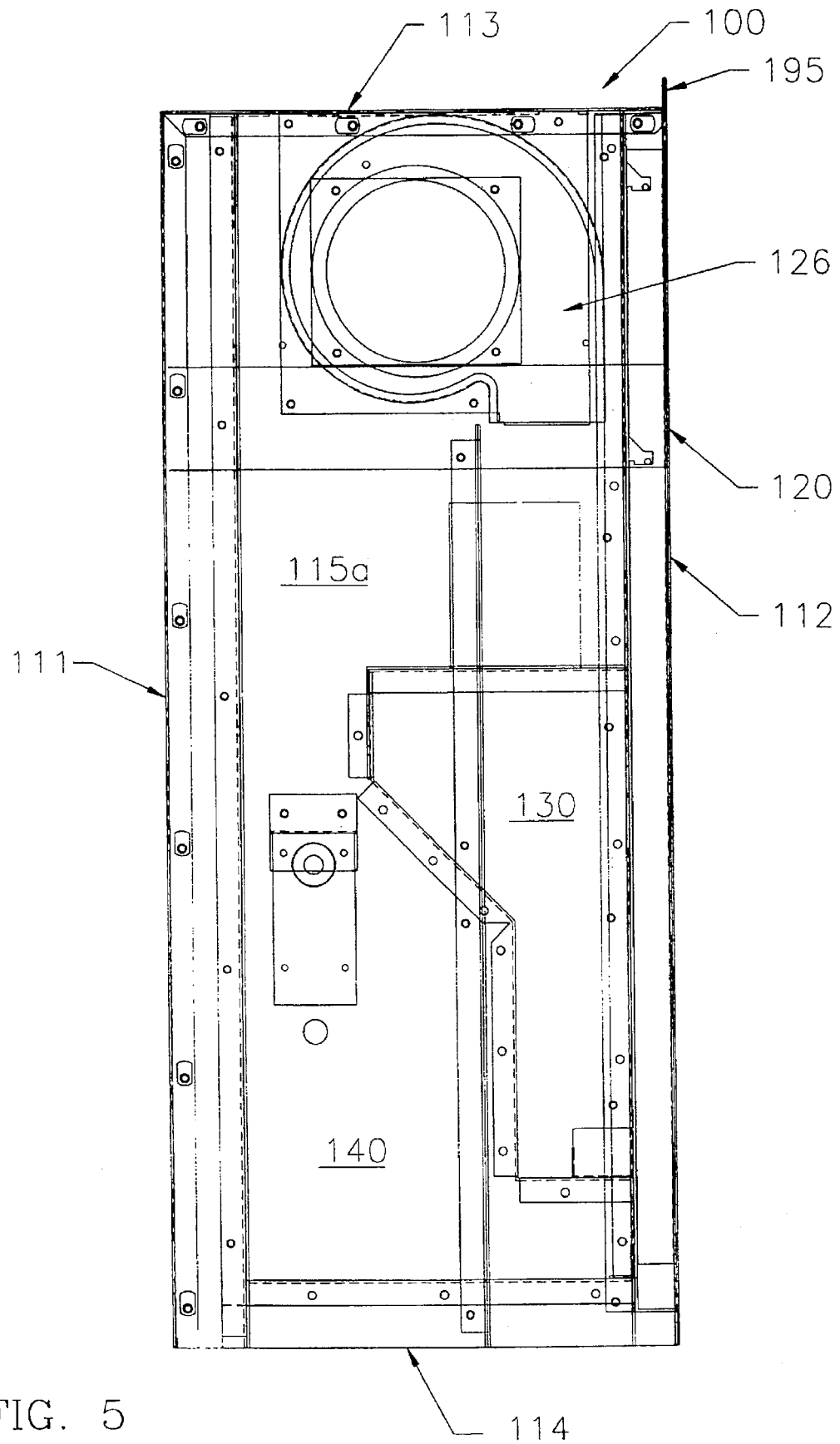
FIG. 5 is a left side elevational view of the structure of FIG. 2.
Figure 14:
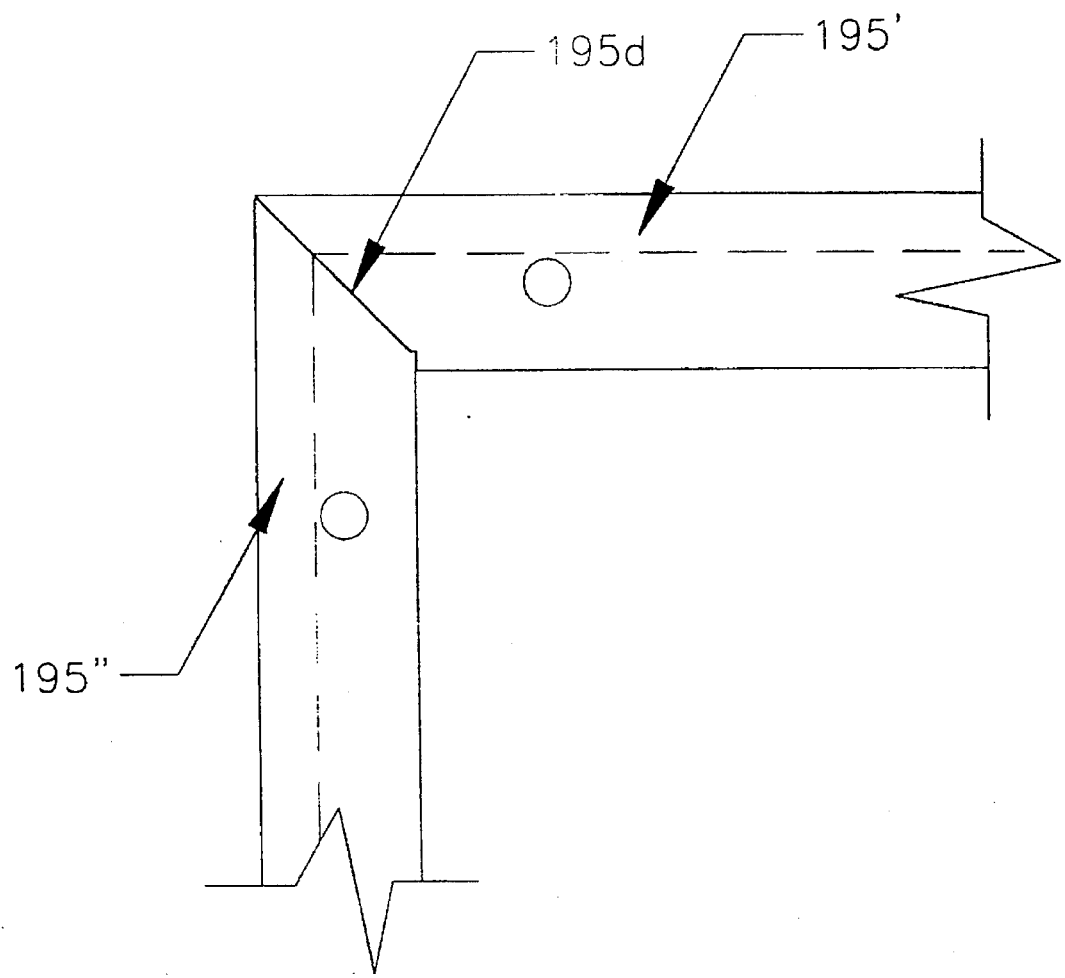
FIG. 14 is an enlarged view of the angled ends of the peripheral flanges illustrated in FIGS. 4 and 10.

In addition, as illustrated in FIGS. 4 and 14, to facilitate the removal of the top [113] and rear [111] of the enclosure [120], an upper horizontal portion [195'] of the peripheral flange [195] may be integrally formed with the top [113] of the enclosure [120] and separate vertical portions [195"] of the peripheral flange [195] may be integrally formed with the front [112] or sides [115] of the enclosure [120]. As illustrated in FIG. 14, the ends of the horizontal portion [195"] and vertical portions [195"] are angled at approximately 45° to permit the ends of the horizontal portion [195'] to engage the angled ends of the vertical portions [195"].

In a second embodiment of the present invention, a cooling system [200] is illustrated in FIGS. 8-12 which is generally of the same configuration and construction as the cooling system [100]. The cooling system [200] comprises an enclosure [220] having a front panel [212], side panels [215a, 215b] and bottom [214] of similar construction to the front [112], sides [115a,115b] and bottom [114] of the enclosure [120]. A removable panel [210] is adapted to be mounted on enclosure [220] to enclose the rear and top of the enclosure [220].

A central divider [216] divides the enclosure [220] into the two isolated regions; that is, the internal circulation region [230] on the side of the central divider [216] proximate the front panel [212] of enclosure [220] and the external circulation region on the opposite side of the central divider [216] proximate the rear of the enclosure [220].

In contrast with enclosure [120], the enclosure [220] is provided with two internal side walls [217a, 217b] which define third and fourth regions [250a] and [250b]. Separate ambient air (condenser) blowers [226a, 226b] for drawing ambient air into the opening [214a] in the bottom [214] of the enclosure [220] are provided in the third and fourth regions [250a, 250b] respectively.

Positioned within each region [150a, 150b] is a discharge duct or tube [260a, 260b] which is connected at one end to the exhaust opening in the housing of the respective ambient air (condenser) blower [226a, 226b]. The discharge duct [260a, 260b] extends downwardly from the blower exhaust opening toward the lower extremity of the enclosure [220]. This end of the discharge duct [260a, 260b] is substantially open such that high velocity ambient air [242c] can be discharged or exhausted from beneath the enclosure [220] by ambient air (condenser) blower [226a, 226b].

The internal circulation region [230] of the enclosure [220] is similar in operation to that of enclosure [120]. The central divider [216] is joined to side panels [215a, 215b] and front panel [212] in such a manner as to effectively seal the internal circulation region [230] from the external circulation region [240]. At least one warm air (evaporator) blower [232] is positioned within the internal circulation region [230] toward the bottom of the enclosure [120] and draws warm air [12] into the internal circulation region [230] through a warm air inlet opening [270] in the front panel [212] of the enclosure [220].

The warm air [12] entering the enclosure [220] is drawn through an evaporator coil [234] known in the art, which is mounted within the internal circulation region [230] of the enclosure. The evaporator coil [234] cools and dehumidifies the warm air passing over it and the warm air (evaporator) blower [232] forces the cooled air [14] within the internal circulation region [230] out of the enclosure [220] and back into the electrical cabinet [10] through exhaust openings [272] in the front panel [212] of the enclosure.

Figure 8:
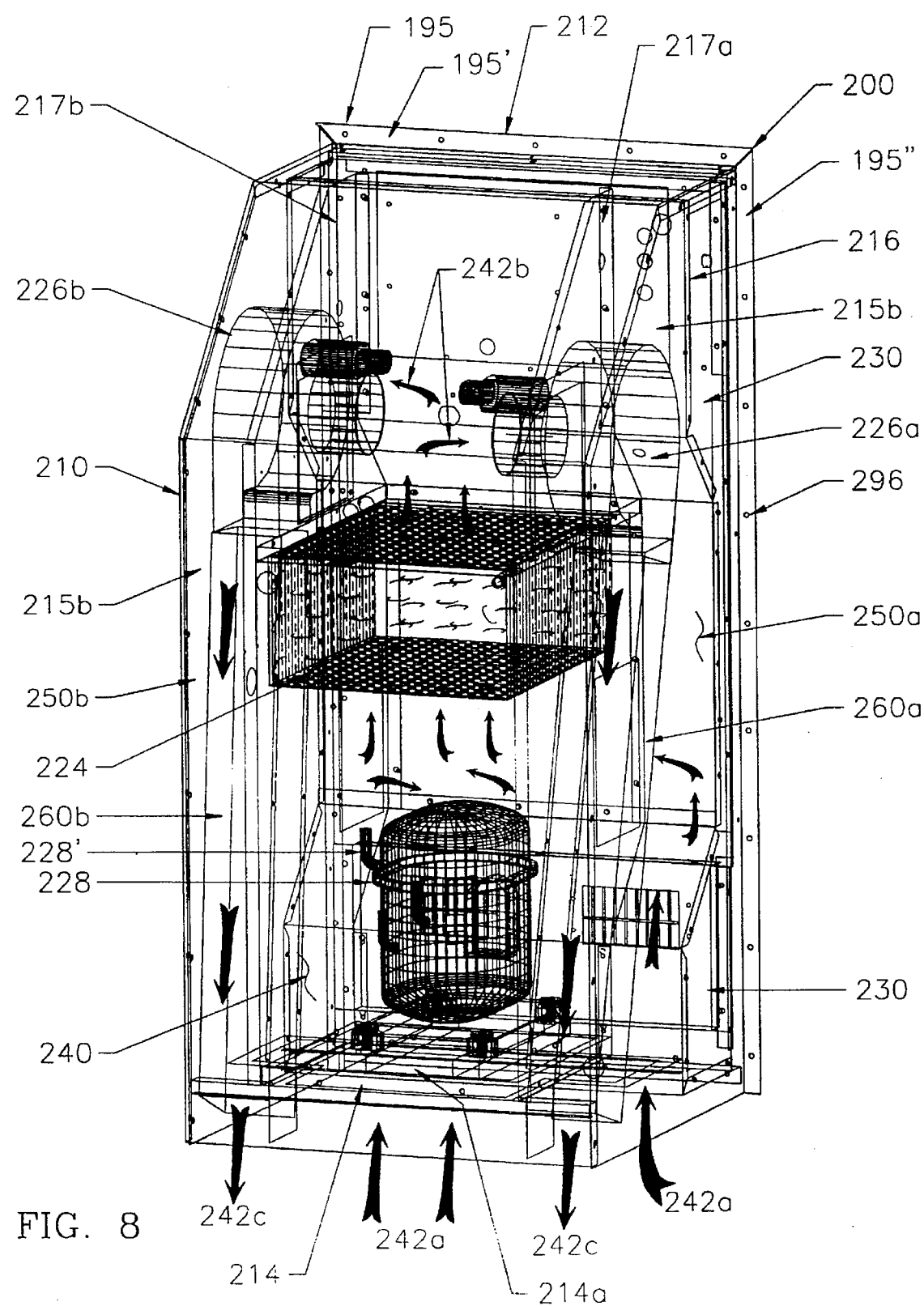
FIG. 8 is a perspective view of the cooling system according to a second preferred embodiment of the present invention.
Figure 9:
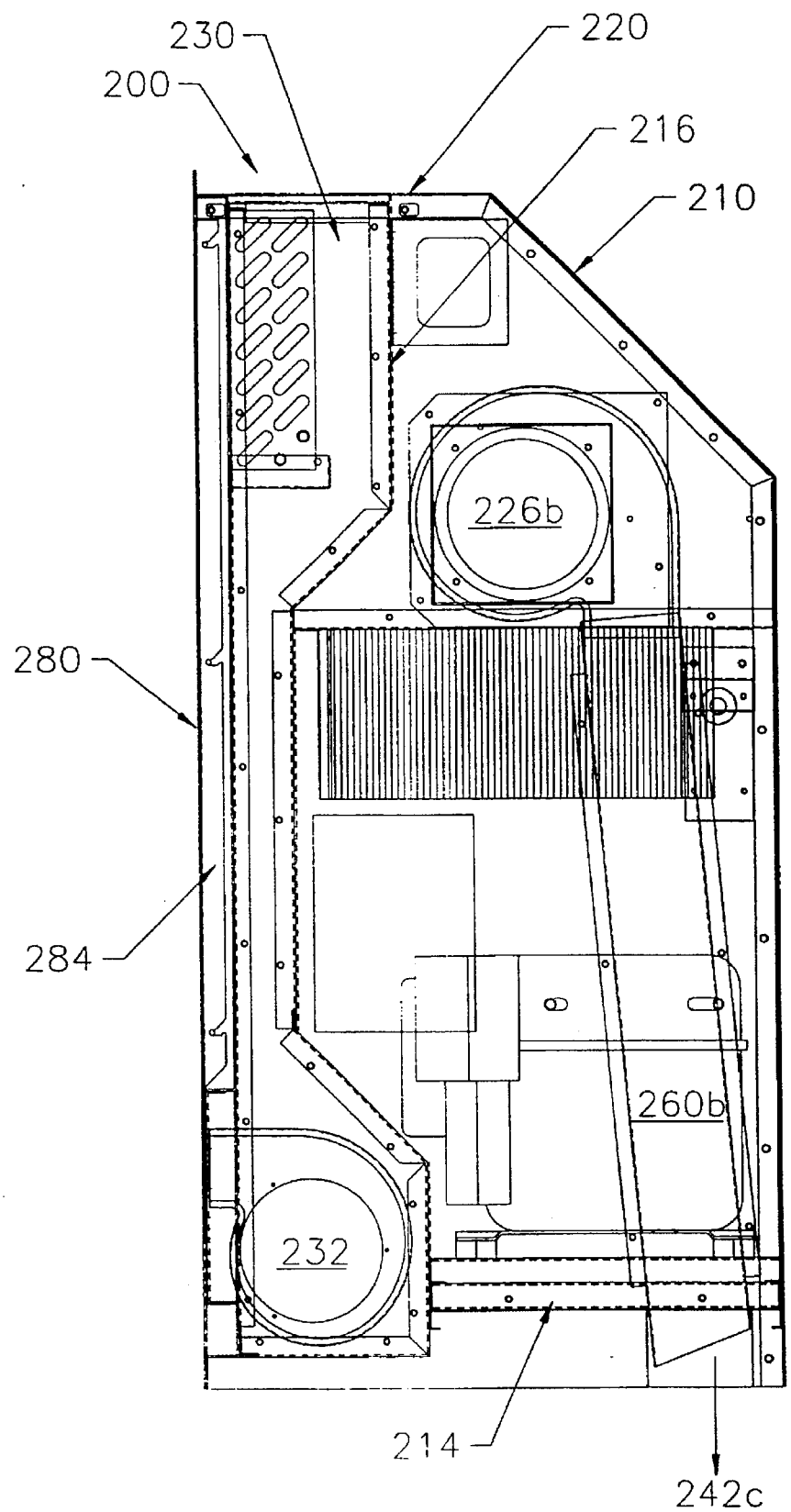
FIG. 9 is a right side elevational view of the structure of FIG. 8.
Figure 10:
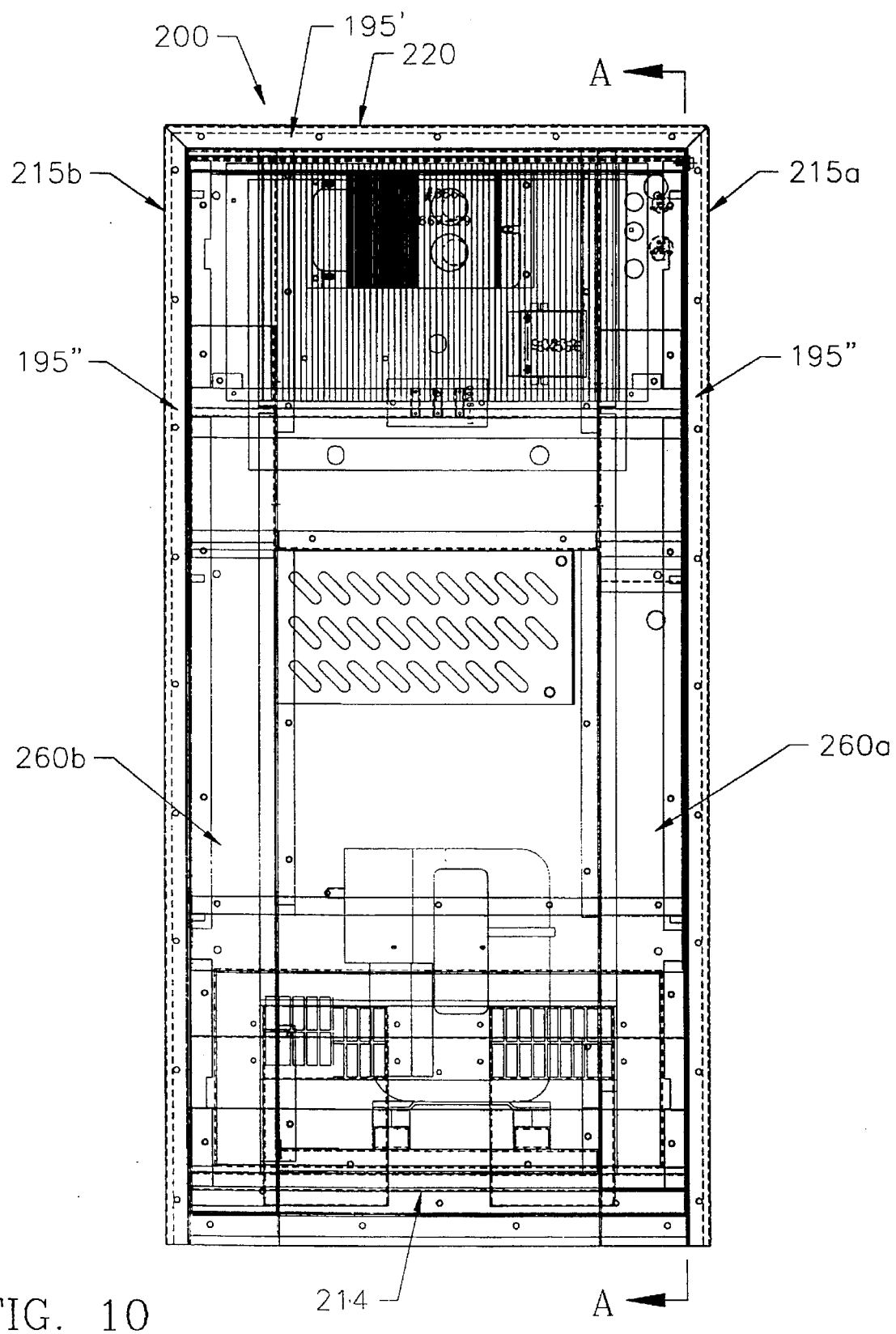
FIG. 10 is a front elevational view of the structure of FIG. 8.
Figure 11:
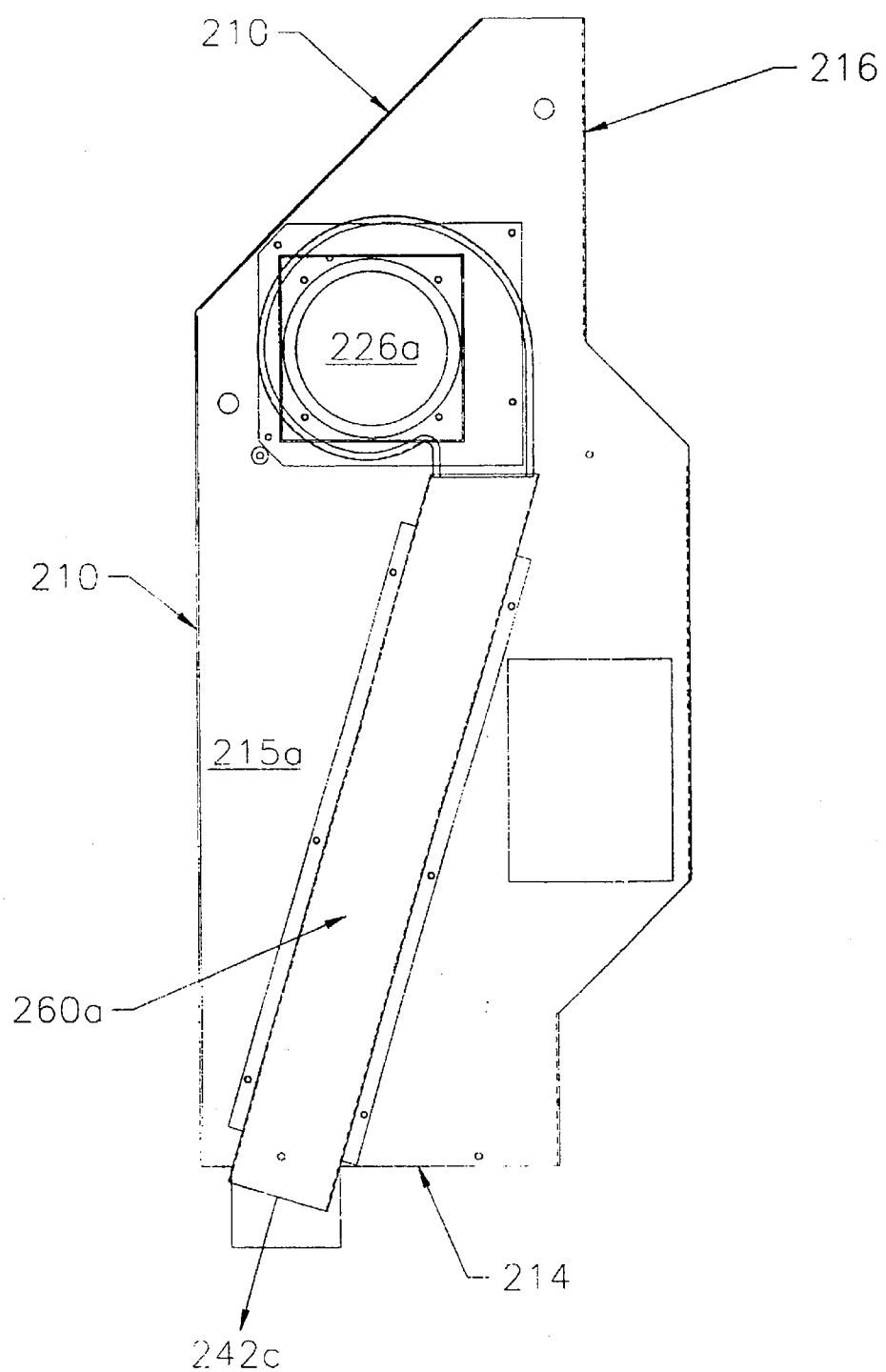
FIG. 11 is a cross sectional view of the structure along line A—A of FIG. 10.
Figure 12:
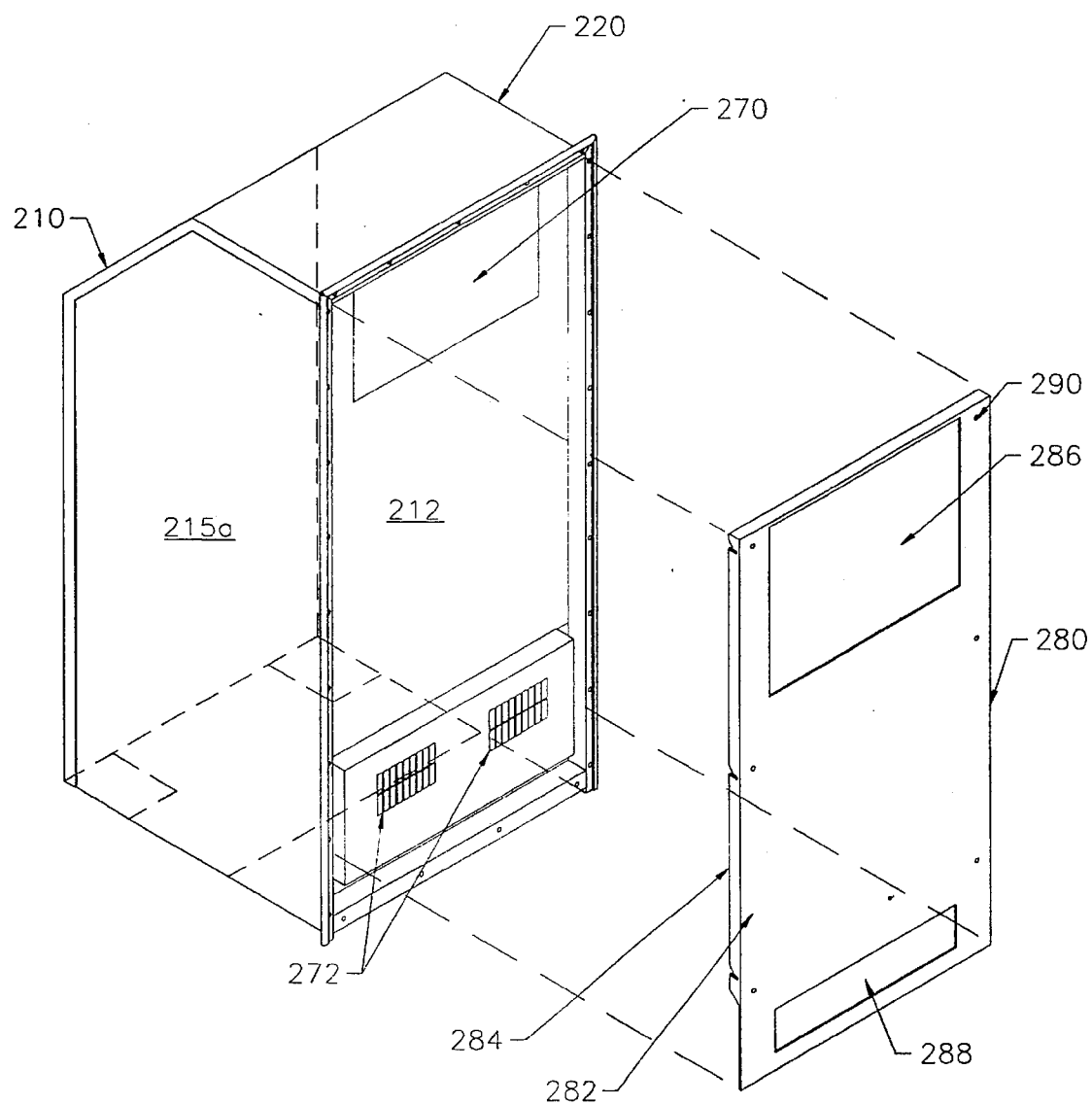
FIG. 12 is an exploded perspective view of the structure of FIG. 8 connected to a mounting template and assembly bracket.

As illustrated in FIGS. 8 and 12, the M/TAB [280] of the second embodiment is generally similar to the above-described M/TAB [180] and the enclosure [220] is provided with peripheral flanges [195] of similar design and shape as described with respect to enclosure [120]. As such, the mounting of the M/TAB [280] and enclosure [220] on the electrical cabinet [10] is accomplished in the same manner described above concerning the cooling unit [100].

Although illustrative preferred embodiments have been described herein in detail, it should be noted and will be appreciated by those skilled in the art that numerous variations may be made within the scope of this invention without departing from the principle of this invention and without sacrificing its chief advantages. Such variations include the substitution of a refrigerant-free heat exchanger for the refrigeration system [22, 28, 124, 128, 224, 228] described above. The terms and expressions have been used herein as terms of description and not terms of limitation. There is no intention to use the terms or expressions to exclude any equivalents of features shown and described or portions thereof and this invention should be defined in accordance with the claims which follow.

What is claimed is:

1. A cooling system for cooling warm air within the interior of a closed electrical cabinet containing electronic equipment, the cooling system comprising:

an enclosure adapted to be mounted on an exterior surface of the cabinet, the enclosure having a top, bottom, front, rear and two sides which define an interior and an exterior of the enclosure;

means for separating the interior of the enclosure into an internal circulation region and an external circulation region, the internal circulation region being fluidly sealed from the external circulation region;

the bottom having an inlet opening and an exhaust opening fluidly connecting the external circulation region to ambient air about the exterior of the enclosure;

ambient air moving means mounted within the external circulation region proximate the top of the enclosure for drawing a flow of ambient air through the inlet opening and for exhausting the drawn ambient air;

a discharge duct having a first end fluidly connected to the ambient air moving means and a second end substantially open at the bottom of the enclosure, the ambient air exhausted from the ambient air moving means being directed through the discharge duct from the first end, through the second end and out the exhaust opening in the bottom of the enclosure; and the exhausted ambient air being discharged from the bottom of the enclosure at a higher velocity than the ambient air being drawn into the bottom of the enclosure.

2. The cooling system according to claim 1, further comprising a plurality of cooperating ambient air moving means and discharge tubes positioned within the external circulation region of the enclosure.

3. The cooling system according to claim 1, wherein the front of the enclosure comprises at least one warm air inlet opening and at least one warm air exhaust opening adapted to be fluidly connected with corresponding openings to be cut in the cabinet upon installation of the cooling system to permit the warm air within the cabinet to pass to and from the internal circulation region of the enclosure.

4. The cooling system according to claim 3, further comprising:

at least one warm air moving means mounted within the internal circulation region of the enclosure and adapted to draw warm air within the cabinet into the internal circulation region through the warm air inlet opening and recirculate the warm air back to the cabinet through the warm air exhaust opening; and heat exchange means mounted within the internal circulation region of the enclosure for cooling the warm air prior to the recirculation of the warm air back to the cabinet.

5. The cooling system according to claim 4, wherein the enclosure further comprises a peripheral flange projecting outwardly from the front of the enclosure and bent at approximately 90° to define a terminal portion of the peripheral flange, the terminal portion having an inside surface proximate the enclosure and an outside surface away from the enclosure for sealing engagement with the exterior surface of the cabinet.

6. The cooling system according to claim 5, wherein an end of the terminal portion is bent approximately 180° so that part of the terminal portion has a thickness twice that of the remainder of the terminal portion.

7. The cooling system according to claim 6, wherein a V-shaped longitudinal rib projects outwardly from the outside portion having part of the terminal portion having an increased thickness.

8. The cooling system according to claim 6, wherein a radiused longitudinal rib projects outwardly from the outside surface of the part of the terminal portion having an increased thickness.

9. The cooling system according to claim 5, wherein an end of the terminal portion is bent at approximately 90° to form an L-shaped configuration about the end.

10. The cooling system according to claim 9, wherein a V-shaped longitudinal rib projects outwardly from the outside surface of the terminal portion.

11. The cooling system according to claim 9, wherein a radiused longitudinal rib projects outwardly from the outside surface of the terminal portion.

12. The cooling system according to claim 5, further comprising a gasket material adapted to be placed about the outside surface of the terminal portion of the peripheral flanges of the enclosure to seal the interface between the enclosure and cabinet.

13. The cooling system according to claim 5, further comprising a bracket for positioning and mounting the enclosure on a surface of the electrical cabinet, the front of the enclosure having a particular shape and dimension, the bracket comprising a plate having vertical sides and a configuration conforming generally to the shape and dimension of the front of the enclosure, the plate having holes through which attachment can be made to mount the bracket to the cabinet surface, each vertical side of the plate having a dependent flange formed at an angle from the plate, the flanges having means for attaching the enclosure to the bracket after the bracket is attached to the cabinet surface to which the bracket and enclosure are to be mounted, the flanges dimensioned so as to be tightly received between the peripheral flanges projecting from the front of the enclosure, the plate having at least one cut out open area to provide egress and ingress of warm air therethrough for fluid communication with the warm air inlet opening and warm air exhaust opening in the front of the enclosure.

14. The cooling system according to claim 13, wherein the cut out open area in the bracket comprises an inlet passage in fluid communication with the warm air inlet opening and an exhaust passage in fluid communication with the warm air exhaust opening in the front of the enclosure.

15. The cooling system according to claim 14, wherein, prior to attaching the enclosure to the bracket, the inlet and exhaust passages in the bracket are adapted to function as a template for cutting corresponding openings in the electrical cabinet to permit the warm air within the cabinet to pass to and from the internal circulation region of the enclosure.

16. The cooling system according to claim 13, further comprising a gasket material adapted to be placed about the circumference of the bracket to seal the interface between the bracket and the cabinet.

17. The cooling system according to claim 13, wherein said means for attaching the enclosure to the bracket comprises a plurality of slots formed in the dependent flanges of the bracket for receiving mating hooks inwardly projecting from the sides of the enclosure proximate the peripheral flanges.

18. The cooling system according to claim 13, wherein said means for attaching the enclosure to the bracket comprises a plurality of hooks outwardly projecting from the dependent flanges of the bracket for insertion within mating slots formed in the peripheral flanges of the enclosure.

19. The cooling system according to claim 1, further comprising an internal side wall within the external circulation region, the internal side wall spaced apart from and parallel to the sides of the enclosure, the internal side wall dividing the external circulation region into an inlet portion and exhaust portion, the inlet opening being located in the inlet portion, and the discharge duct and exhaust opening being located within the exhaust portion.

20. The cooling system according to claim 2, further comprising a pair of internal side walls within the external circulation region, each internal side wall being proximate a side of the enclosure and spaced apart from and parallel to that side, the internal side walls dividing the external circulation region into an inlet portion between the internal side walls and separate exhaust portions between each internal side wall and proximate side of the enclosure, the inlet opening being located in the inlet portion, and a discharge duct and exhaust opening being located within each exhaust portion.

21. A cooling system for cooling warm air within the interior of a closed electrical cabinet, the cooling system comprising:
an enclosure having a bottom portion, a front portion and opposing side portions, the enclosure adapted to be mounted on an upright exterior surface of the cabinet so that the bottom portion of the enclosure is perpendicular to the upright exterior surface of the cabinet;
means for separating the interior of the enclosure into an internal circulation region and an external circulation region, the internal circulation region being fluidly sealed from the external circulation region;
the bottom portion having an inlet opening and an exhaust opening fluidly connecting the external circulation region to ambient air outside the enclosure;
ambient air moving means mounted within the external circulation region for drawing ambient air into the external circulation region through the inlet opening in the bottom of the enclosure and for exhausting the ambient air from the enclosure through the exhaust opening in the bottom of the enclosure.

22. The cooling system according to claim 21, further comprising:
a discharge duct positioned in the external circulation region, the discharge duct having a first end fluidly connected to the ambient air moving means and a second end substantially open at the bottom of the enclosure, the ambient air exhausted from the ambient air moving means being directed through the discharge duct from the first end, through the second end and out the exhaust opening in the bottom of the enclosure.

23. The cooling system according to claim 22, further comprising a plurality of cooperating ambient air moving means and discharge tubes positioned within the external circulation region of the enclosure.

24. The cooling system according to claim 23, further comprising a pair of internal side walls within the external circulation region, each internal side wall being proximate a side of the enclosure and spaced apart from and parallel to that side, the internal side walls dividing the external circulation region into an inlet portion between the internal side walls and separate exhaust portions between each internal side wall and proximate side of the enclosure, the inlet opening being located in the inlet portion, and a discharge duct and exhaust opening being located within each exhaust portion.

25. A cooling system for cooling warm air within the interior of a closed electrical cabinet, the cooling system comprising:
an enclosure adapted to be mounted on an exterior surface of the cabinet, the enclosure having a bottom portion, a front portion and opposing side portions;
means for separating the interior of the enclosure into an internal circulation region and an external circulation region, the internal circulation region being fluidly sealed from the external circulation region;
the bottom portion having an inlet opening and an exhaust opening fluidly connecting the external circulation region to ambient air outside the enclosure;

ambient air moving means mounted within the external circulation region for drawing ambient air into the external circulation region through the inlet opening in the bottom of the enclosure and for exhausting the ambient air from the enclosure through the exhaust opening in the bottom of the enclosure;

a discharge duct positioned in the external circulation region, the discharge duct having a first end fluidly connected to the ambient air moving means and a second end substantially open at the bottom of the enclosure, the ambient air exhausted from the ambient air moving means being directed through the discharge duct from the first end, through the second end and out the exhaust opening in the bottom of the enclosure, wherein the exhausted ambient air is discharged from the bottom of the enclosure at a higher velocity than the ambient air being drawn into the inlet opening in the bottom of the enclosure.

26. The cooling system according to claim 25, further comprising an internal side wall within the external circulation region, the internal side wall spaced apart from and parallel to the sides of the enclosure, the internal side wall dividing the external circulation region into an inlet portion and exhaust portion, the inlet opening being located in the inlet portion, and the discharge duct and exhaust opening being located within the exhaust portion.

27. A cooling system for cooling warm air within the interior of a closed electrical cabinet, the cooling system comprising:

an enclosure adapted to be mounted on an exterior surface of the cabinet, the enclosure having a bottom portion, a front portion and opposing side portions;

means for separating the interior of the enclosure into an internal circulation region and an external circulation region, the internal circulation region being fluidly sealed from the external circulation region;

the bottom portion having an inlet opening and an exhaust opening fluidly connecting the external circulation region to ambient air outside the enclosure;

ambient air moving means mounted within the external circulation region for drawing ambient air into the external circulation region through the inlet opening in the bottom of the enclosure and for exhausting the ambient air from the enclosure through the exhaust opening in the bottom of the enclosure, wherein the front of the enclosure comprises at least one warm air inlet opening and at least one warm air exhaust opening adapted to be fluidly connected with corresponding openings to be cut in the cabinet upon installation of the cooling system to permit the warm air within the cabinet to pass to and from the internal circulation region of the enclosure.

28. The cooling system according to claim 27, further comprising:

at least one warm air moving means mounted within the internal circulation region of the enclosure and adapted to draw warm air within the cabinet into the internal circulation region through the warm air inlet opening and recirculate the warm air back to the cabinet through the warm air exhaust opening; and heat exchange means mounted within the internal circulation region of the enclosure for cooling the warm air prior to the recirculation of the warm air back to the cabinet.

29. The cooling system according to claim 28, wherein the enclosure further comprises a peripheral flange projecting outwardly from the front of the enclosure and bent at approximately 90° to define a terminal portion of the peripheral flange, the terminal portion having an inside surface proximate the enclosure and an outside surface away from the enclosure for sealing engagement with the exterior surface of the cabinet.

30. The cooling system according to claim 29, wherein an end of the terminal portion is bent approximately 180° so that part of the terminal portion has a thickness twice that of the remainder of the terminal portion.

31. The cooling system according to claim 30, wherein a V-shaped longitudinal rib projects outwardly from the outside surface of the part of the terminal portion having an increased thickness.

32. The cooling system according to claim 30, wherein a radiused longitudinal rib projects outwardly from the outside surface of the part of the terminal portion having an increased thickness.

33. The cooling system according to claim 29, wherein an end of the terminal portion is bent at approximately 90° to form an L-shaped configuration about the end.

34. The cooling system according to claim 33, wherein a V-shaped longitudinal rib projects outwardly from the outside surface of the terminal portion.

35. The cooling system according to claim 33, wherein a radiused longitudinal rib projects outwardly from the outside surface of the terminal portion.

36. The cooling system according to claim 29, further comprising a gasket material adapted to be placed about the outside surface of the terminal portion of the peripheral flanges of the enclosure to seal the interface between the enclosure and cabinet.

37. The cooling system according to claim 29, further comprising a bracket for positioning and mounting the enclosure on a surface of the electrical cabinet, the front of the enclosure having a particular shape and dimension, the bracket comprising a plate having vertical sides and a configuration conforming generally to the shape and dimension of the front of the enclosure, the plate having holes through which attachment can be made to mount the bracket to the cabinet surface, each vertical side of the plate having a dependent flange formed at an angle from the plate, the flanges having means for attaching the enclosure to the bracket after the bracket is attached to the cabinet surface to which the bracket and enclosure are to be mounted, the flanges dimensioned so as to be tightly received between the peripheral flanges projecting from the front of the enclosure, the plate having at least one cut out open area to provide egress and ingress of warm air therethrough for fluid communication with the warm air inlet opening and warm air exhaust opening in the front of the enclosure.

38. The cooling system according to claim 37, wherein said cut out open area in the bracket comprises an inlet passage in fluid communication with the warm air inlet opening and an exhaust passage in fluid communication with the warm air exhaust opening in the from of the enclosure.

39. The cooling system according to claim 38, wherein, prior to attaching the enclosure to the bracket, the inlet and exhaust passages in the bracket are adapted to function as a template for cutting corresponding openings in the electrical cabinet to permit the warm air within the cabinet to pass to and from the internal circulation region of the enclosure.

40. The cooling system according to claim 37, further comprising a gasket material adapted to be placed about the circumference of the bracket to seal the interface between the bracket and the cabinet.

41. The cooling system according to claim 37, wherein said means for attaching the enclosure to the bracket comprises a plurality of slots formed in the dependent flanges of the bracket for receiving mating hooks inwardly projecting from the side portions of the enclosure proximate the peripheral flanges.

42. The cooling system according to claim 37, wherein said means for attaching the enclosure to the bracket comprises a plurality of hooks outwardly projecting from the dependent flanges of the bracket for insertion within mating slots formed in the peripheral flanges of the enclosure.

43. A temperature controlled electrical cabinet, comprising:

a sealed cabinet having an interior containing warm air and at least one cut-out portion therethrough;

a cooling system enclosure mounted on an exterior surface of the cabinet over the cut-out portion, the enclosure having a top, bottom, front, rear and two sides which define an interior and an exterior of the enclosure;

means for separating the interior of the enclosure into an internal circulation region and an external circulation region, the internal circulation region being fluidly sealed from the external circulation region;

the enclosure bottom having an inlet opening and an exhaust opening fluidly connecting the external circulation region to ambient air about the exterior of the enclosure;

ambient air moving means mounted within the external circulation region proximate the top of the enclosure for drawing ambient air through the inlet opening and for exhausting the drawn ambient air;

a discharge duct having a first end fluidly connected to the ambient air moving means and a second end substantially open at the bottom of the enclosure, the ambient air exhausted from the ambient air moving means being directed through the discharge duct from the first end, through the second end and out the exhaust opening in the bottom of the enclosure, the exhausted ambient air being discharged from the bottom of the enclosure at a higher velocity than the ambient air being drawn into the bottom of the enclosure;

the front of the enclosure having at least one warm air inlet opening and at least one warm air exhaust opening adapted to be fluidly connected with cut-out portion in the cabinet to permit the warm air within the cabinet to pass to and from the internal circulation region of the enclosure.

44. The temperature controlled electrical cabinet according to claim 43, further comprising a plurality of cooperating ambient air moving means and discharge tubes positioned within the external circulation region of the enclosure.

45. The temperature controlled electrical cabinet according to claim 43, further comprising:

at least one warm air moving means mounted within the internal circulation region of the enclosure for drawing warm air within the cabinet through the cut-out opening and into the internal circulation region through the warm air inlet opening and for recirculating the warm air back to the cabinet through the warm air exhaust opening and cut-out opening; and heat exchange means mounted within the internal circulation region of the enclosure for cooling the warm air prior to recirculating the warm air back into the cabinet.

46. The cooling system according to claim 45, wherein the enclosure further comprises a peripheral flange projecting outwardly from the front of the enclosure and bent at approximately 90° to define a terminal portion of the peripheral flange, the terminal portion having an inside surface proximate the enclosure and an outside surface away from the enclosure for sealing engagement with the exterior surface of the cabinet.

47. The cooling system according to claim 46, wherein an end of the terminal portion is bent approximately 180° so that part of the terminal portion has a thickness twice that of the remainder of the terminal portion.

48. The cooling system according to claim 47, wherein a V-shaped longitudinal rib projects outwardly from the outside surface of the part of the terminal portion having an increased thickness.

49. The cooling system according to claim 47, wherein a radiused longitudinal rib projects outwardly from the outside surface of the part of the terminal portion having an increased thickness.

50. The cooling system according to claim 46, wherein an end of the terminal portion is bent at approximately 90° to form an L-shaped configuration about the end.

51. The cooling system according to claim 50, wherein a V-shaped longitudinal rib projects outwardly from the outside surface of the terminal portion.

52. The cooling system according to claim 50, wherein a radiused longitudinal rib projects outwardly from the outside surface of the terminal portion.

53. The cooling system according to claim 46, further comprising a gasket material adapted to be placed about the outside surface of the terminal portion of the peripheral flanges of the enclosure to seal the interface between the enclosure and cabinet.

54. The temperature controlled electrical cabinet according to claim 46, further comprising a bracket for positioning and mounting the enclosure onto the electrical cabinet, the front of the enclosure having a particular shape and dimension, the bracket comprising a plate having vertical sides and a configuration conforming generally to the shape and dimension of the from of the enclosure, the plate having holes for mounting the bracket to the cabinet surface, each vertical side of the plate having a dependent flange formed at an angle from the plate, the flanges having means for attaching the enclosure to the bracket after the bracket is attached to the cabinet surface to which the bracket and enclosure are to be mounted, the flanges dimensioned so as to be tightly received between the peripheral flanges projecting from the from of the enclosure, the plate having at least one open area in fluid connection with the warm air inlet and exhaust openings in the front of the enclosure and the cut-out portion in the cabinet.

55. The cooling system according to claim 54, further comprising a gasket material adapted to be placed about the circumference of the bracket to seal the interface between the bracket and the cabinet.

56. The cooling system according to claim 54, wherein said means for attaching the enclosure to the bracket comprises a plurality of slots formed in the dependent flanges of the bracket for receiving mating hooks inwardly projecting from the sides of the enclosure proximate the peripheral flanges.

57. The cooling system according to claim 54, wherein said means for attaching the enclosure to the bracket comprises a plurality of hooks outwardly projecting from the dependent flanges of the bracket for insertion within mating slots formed in the peripheral flanges of the enclosure.

58. The cooling system according to claim 43, further comprising an internal side wall within the external circulation region, the internal side wall spaced apart from and parallel to the sides of the enclosure, the internal side wall dividing the external circulation region into an inlet portion and exhaust portion, the inlet opening being located in the inlet portion, and the discharge duct and exhaust opening being located within the exhaust portion.

59. The cooling system according to claim 44, further comprising a pair of internal side walls within the external circulation region, each internal side wall being proximate a side of the enclosure and spaced apart from and parallel to that side, the internal side walls dividing the external circulation region into an inlet portion between the internal side walls and separate exhaust portions between each internal side wall and proximate side of the enclosure, the inlet opening being located in the inlet portion, and a discharge duct and exhaust opening being located within each exhaust portion.

\* \* \* \* \*